United States Patent
Tsamis et al.

(10) Patent No.: US 7,619,422 B2
(45) Date of Patent: Nov. 17, 2009

(54) CENTRALIZED HIRF DETECTION SYSTEM

(75) Inventors: Demetri Tsamis, Cedar Rapids, IA (US); Steven E. Koenck, Cedar Rapids, IA (US)

(73) Assignee: Rockwell Collins, Inc., Cedar Rapids, IA (US)

( * ) Notice: Subject to any disclaimer, the term of this patent is extended or adjusted under 35 U.S.C. 154(b) by 0 days.

(21) Appl. No.: 11/784,910

(22) Filed: Apr. 10, 2007

(65) Prior Publication Data

US 2008/0180113 A1    Jul. 31, 2008

Related U.S. Application Data

(62) Division of application No. 11/353,706, filed on Feb. 13, 2006, now Pat. No. 7,218,123.

(51) Int. Cl.
*G01R 27/26* (2006.01)
*G01R 25/00* (2006.01)

(52) U.S. Cl. ............... 324/683; 324/658; 324/86

(58) Field of Classification Search ........... 324/658, 324/457, 72, 76.11, 683, 86
See application file for complete search history.

(56) References Cited

U.S. PATENT DOCUMENTS

| 3,667,036 A | * | 5/1972 | Seachman | 324/72 |
| 4,215,345 A | * | 7/1980 | Frosch et al. | 342/465 |
| 4,853,639 A | * | 8/1989 | Vosteen et al. | 324/457 |
| 5,502,375 A | * | 3/1996 | Marek | 324/133 |

* cited by examiner

*Primary Examiner*—Vincent Q Nguyen
(74) *Attorney, Agent, or Firm*—Daniel M. Barbieri

(57) ABSTRACT

The present invention is a detection device, system and method for detecting an external electromagnetic event such as lightning or a high intensity radiated field. In an exemplary embodiment, the detection device includes a free space capacitive sensor and a protected amplifier circuit coupled with the free space capacitive sensor. The free space capacitive sensor and the protected amplifier circuit are configured to respond to a voltage waveform produced by an external electromagnetic event. The free space capacitive sensor serves as a single input capable of detecting the external electromagnetic event and the coupling of the free space capacitive sensor to the protected amplifier circuit allows subsystems in communication with the sensor and amplifier circuit to generate a coordinated response to the detected external electromagnetic event.

6 Claims, 5 Drawing Sheets

CENTRALIZED HIRF DETECTION SYSTEM

CROSS REFERENCE TO RELATED APPLICATIONS

The present application is a divisional application of U.S. patent application Ser. No. 11/353,706 filed on Feb. 13, 2006 now U.S. Pat. No. 7,218,123. Said U.S. patent application Ser. No. 11/353,706 is hereby incorporated by reference in its entirety.

FIELD OF THE INVENTION

The present invention relates generally to the field of avionics and more particularly to a method and a system for centralized high intensity radiated field (HIRF) detection.

BACKGROUND OF THE INVENTION

Lightning and high intensity radiated field (HIRF) tolerance are critical for safe operation of aircraft in harsh environmental conditions. For instance, aircraft require continued, uninterrupted access to systems that perform functions related to flight takeoff, maintenance of flight, and landing under normal and severe HIRF conditions. Aerospace industry experience has contributed to a steady increase in the required level of lightning and HIRF tolerance for new aircraft designs, especially as more subsystems are implemented by using electronic solutions. In addition, aircraft design and construction increasingly uses non-conductive materials such as carbon fibre composites and plastics that provide less shielding than their metal predecessors increasing the need to provide HIRF tolerance.

Presently available systems for detecting lightning and HIRF are limited by the inability to form a common response, resulting in random, often contradicting identification of HIRF presence. For instance, present avionics architecture for a typical commercial airplane communications, navigation and surveillance (CNS) avionics suite is configured so that each line replaceable unit (LRU) has self-sustained HIRF and high energy radio frequency (HERF) protective circuitry. Such configuration results in each LRU reacting to HIRF differently and asynchronously depending upon LRU location, interference from adjacent systems, and each LRU's functional requirements, which leads to sporadic, unsynchronized responses. The HIRF response is ambiguous at best, as even critical systems (e.g., autopilot, landing/navigation aids, and the like) may have varying and/or unsynchronized reactions in the presence of HIRF. Thus, HIRF protection is unsynchronized amidst present avionic systems, which often results in no-fault found (NFF) and unnecessary LRU removals from the subject airplane.

Therefore, it would be desirable to provide a system and method of centralized high intensity radiated field (HIRF) detection, allowing an overall system awareness and subsequent coordinated response to the HIRF event.

SUMMARY OF THE INVENTION

In accordance with a first aspect of the present invention, a detection device is provided. In such aspect, the detection device includes a free space capacitive sensor and a protected amplifier circuit coupled with the free space capacitive sensor. The free space capacitive sensor and the protected amplifier circuit are configured to respond to a voltage waveform produced by an external electromagnetic event such as a lightning strike. The free space capacitive sensor serves as a single input capable of detecting the external electromagnetic event and the coupling of the free space capacitive sensor to the protected amplifier circuit allowing subsystems in communication with the sensor and amplifier circuit to generate a synchronized response to the detected external electromagnetic event.

In accordance with an additional aspect of the present invention, a centralized detection system capable of detecting a HIRF or external electromagnetic event such as lightning is provided. In the present aspect, the system may include a communication system for receiving and transmitting all communication operations for an aircraft. In addition, a detector may be communicatively coupled to the subsystem. For instance, the detector may detect at least one of a HIRF or an external electromagnetic event and notify the subsystem of the HIRF or external electromagnetic event. Further, the detector serves as a single input which detects and notifies the communication system of the HIRF or lightning event allowing the communication system to generate a synchronized response.

In accordance with another aspect of the present invention, a method for detecting HIRF or an external electromagnetic event is provided. The method may include detecting at least one of a HIRF or an external electromagnetic event. In addition, the method may include notifying a communication system of the at least one HIRF or external electromagnetic event. The communication system may be responsible for receiving and transmitting communication operations for an aircraft. The communication system may receive the notification of the HIRF or external electromagnetic event and synchronize a response to such notification. Moreover, the method may include transmitting a common response to aircraft systems.

It is to be understood that both the foregoing general description and the following detailed description are exemplary and explanatory only and are not restrictive of the invention as claimed. The accompanying drawings, which are incorporated in and constitute a part of the specification, illustrate an embodiment of the invention and together with the general description, serve to explain the principles of the invention.

BRIEF DESCRIPTION OF THE DRAWINGS

The numerous advantages of the present invention may be better understood by those skilled in the art by reference to the accompanying figures in which.

DETAILED DESCRIPTION OF THE INVENTION

Reference will now be made in detail to the presently preferred embodiments of the invention, examples of which are illustrated in the accompanying drawings. It is to be appreciated that corresponding reference numbers refer to generally corresponding structures.

Figure 1:
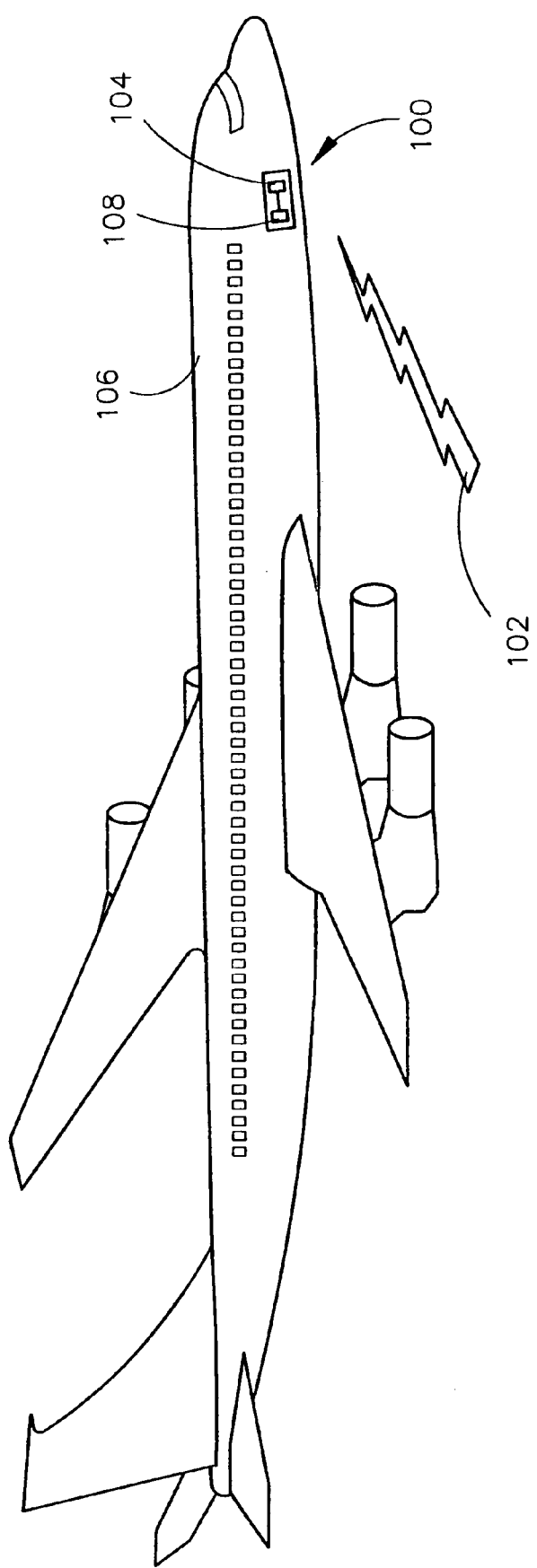
FIG. 1 is a schematic diagram of an aircraft including a detection device for detecting HIRF or an external electromagnetic event in accordance with an exemplary embodiment of the present invention.

Referring to FIG. 1, a system 100 for detecting HIRF or an external electromagnetic event 102 such as lightning, precipitation static, electromagnetic pulse, electrostatic discharge, and the like is provided. In an exemplary embodiment, the system 100 may include a communication system 104 for receiving and transmitting all communication operations for an aircraft 106. For example, the communication system 104 is a software defined radio communication system. Further, the system 100 may include a detector 108 which is communicatively coupled to the subsystem for detecting at least one of a HIRF or an external electromagnetic event and notifying the subsystem of the HIRF or external electromagnetic event. For instance, the detector 108 may serve as a single input which detects and notifies the communication system of at least one of the HIRF or lightning event allowing the communication system 104 to generate a synchronized response (e.g., physically clamping sensitive components or circuit elements or providing a system-wide notification of the event requiring a coordinated self test, recovery operation, or the like).

Figure 2:
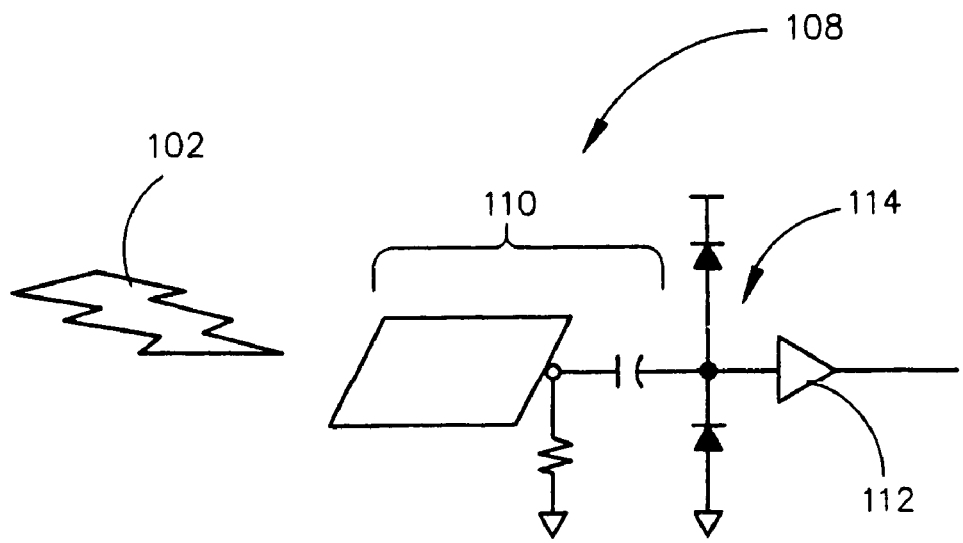
FIG. 2 is a schematic diagram of components included within the detection device in accordance with an exemplary embodiment of the present invention, wherein the components are configured to primarily detect an electromagnetic event such as lightning.

Referring to FIG. 2, an embodiment of the detection device 108 which the system 100 may utilize to detect an electromagnetic event 102 such as lightning is provided. As illustrated in FIG. 2, the detection device 108 may include a free space capacitive sensor 110 and a protected amplifier circuit 112 coupled with the free space capacitive sensor 110 to allow the detector 108 to detect an event such as lightning. In addition, such embodiment may include a clamping circuit 114 capable of clamping the voltage waveform at a specified voltage. The detection device 108 may respond very quickly to the voltage waveform associated with a lighting strike to allow an efficient system-wide notification of the event. Other sensors responsive to a spatially distributed electrical field gradient could also be used to detect an electromagnetic condition or event. A sensor responsive to electrical field gradients is preferred over a magnetic sensor due to the generally faster response behavior. Alternative sensors may include laser based plasma detectors or the like without departing from the spirit and scope of the invention. A sensor responsive to field strength gradient such as a plasma detector could provide an advanced indication of increased probability of a lightning strike, which could be used to place a system such as a software defined radio into a predetermined lightning or HIRF preparation mode. Such a preparation mode might include temporarily pausing unneeded background software tasks to allow quicker execution of recovery software routines, or causing available redundant subsystems to be configured for operation if a main subsystem should become temporarily unavailable.

Figure 3B:
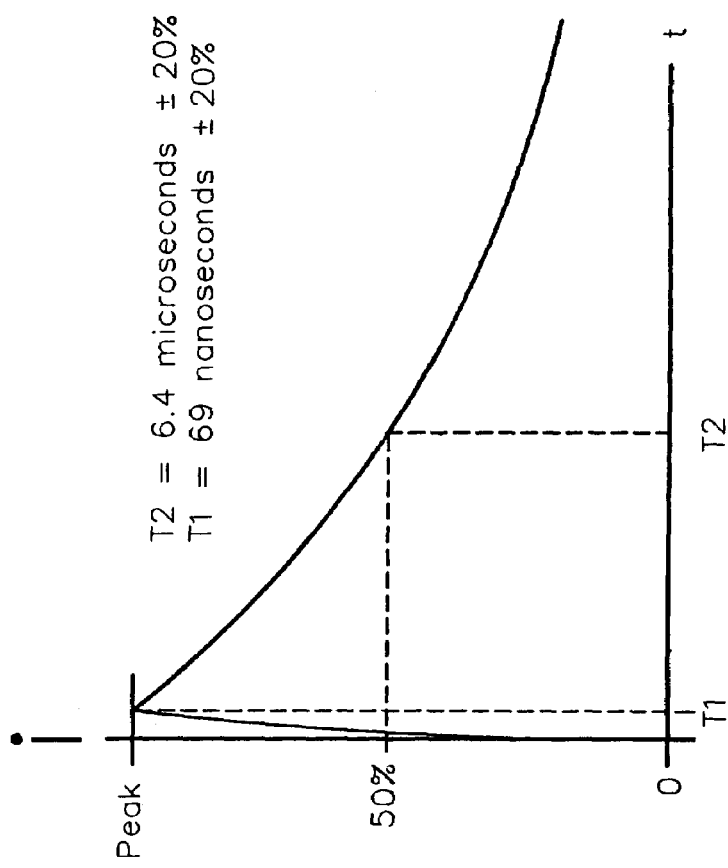
FIG. 3B is a graphical depiction of an exemplary induced current waveform of lightning.
Figure 3A:
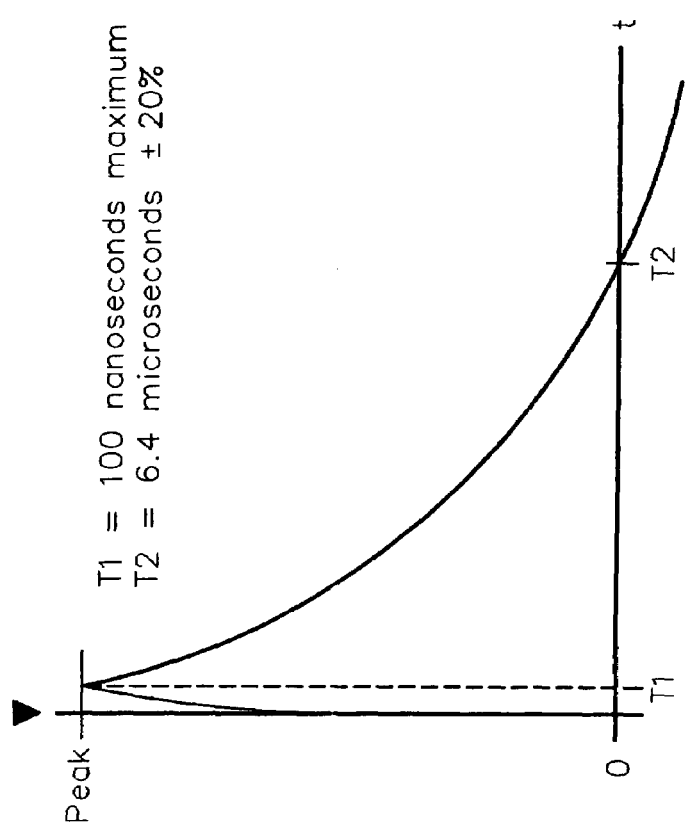
FIG. 3A is a graphical depiction of an exemplary voltage waveform of lightning.

Referring to FIGS. 3A and 3B, a graphical depiction of an exemplary voltage waveform and induced current of lightning is provided. As illustrated in FIG. 3A, the voltage waveform associated with a lightning strike typically has a rise time of a few nanoseconds. Further, as demonstrated in FIG. 3B, the induced current waveform typically has a characteristic rise time of approximately six microseconds due to the inductive impedance of the conductors that may carry the current. Typically, fifty percent of the induced current has dissipated after approximately sixty-nine microseconds. FIG. 3B. Thus, clamping circuits 114 may be capable of responding to the voltage waveform to protect certain components or circuit elements before the current waveform has had time to build to its peak value. For example, the clamping circuits 114 may clamp or fix the top of the waveform to a voltage that may prevent damage or upset the sensitive components or circuit elements.

In a further embodiment, the detection device 108 may be scalable allowing the device 108 to be programmed to alert the subsystem once a voltage waveform above a specified threshold is detected. For instance, the specified threshold is according to at least one of an aircraft certification guideline or mission requirement. Such configuration is advantageous for it may allow the device to be used on multiple aircraft models. In an additional embodiment, the detection device 108 may be configured to provide a warning signal to allow critical systems to be given advanced warning of a likely lightning strike or HIRF. The advanced warning, in turn, may provide a window of time in which system behaviors across multiple avionic LRUs may be coordinated in a deterministic manner. For example, the detection device reaction limit during en-route operations could be different from the limit during approach/landing operations.

Figure 4A:
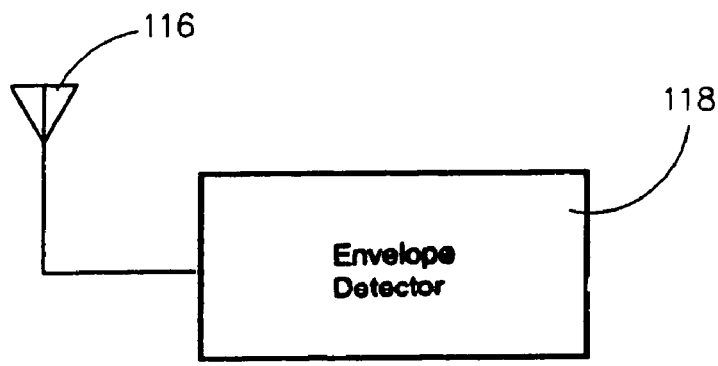
FIG. 4A is a schematic diagram of additional detector components in accordance with an exemplary embodiment of the present invention, wherein the components are configured to primarily detect radio frequency energy.
Figure 4B:
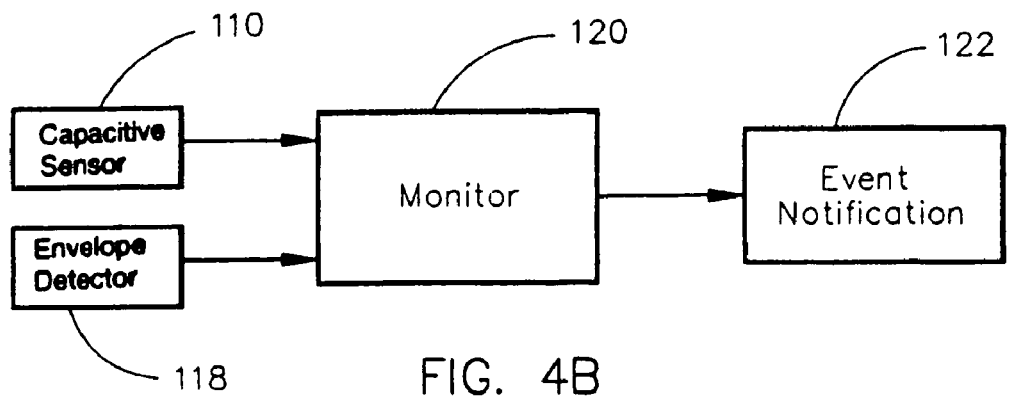
FIG. 4B is a schematic diagram of a single monitor in accordance with an exemplary embodiment of the present invention, wherein the single monitor is capable of generating a single Event Notification signal to an avionics system.

Referring to FIG. 4A, additional components of the detection device 108 in accordance with an exemplary embodiment of the present invention are provided. As illustrated in FIG. 4A, the detection device 108 may include a broadband antenna 116 and an envelope detector 118. For example, a high speed envelope detector is employed. In such embodiment, the detection device 108 is directed toward detecting radio frequency energy, particularly above 1 gigahertz (Ghz). The free space capacitive sensor of FIG. 2 and the high speed envelope detector of FIG. 4A may be combined in a single monitor 120 to generate a single Event Notification signal 122 to a system such as an avionics system as illustrated in FIG. 4B.

In even further exemplary embodiments, the synchronized response may be multi-tiered. For instance, the response may be two-tiered in which operations in a first tier are synchronized and not interrupted by the HIRF or external electromagnetic event while an operation in a second tier are suspended. In such instances, first-tier operations may include, but are not limited to, flight critical systems such as primary flight control and fly by wire. Such systems are essential to flight operations and thus, must not be interrupted by the HIRF or external electromagnetic event. In contrast, second-tier operations such as those which are not essential to flight control may be suspended or put into a hold position for a brief period of time during a lightning or HIRF event. The period of time is to be of a duration sufficient to avoid the most intense portion of the lightning or HIRF event.

It is contemplated that the disclosed system 100 may utilize existing aircraft protocols for synchronization and provide a uniform response to a detected HIRF or external electromagnetic event. For instance, existing protocols such as Aeronautical Radio, Inc. (ARINC) 429, ARINC 629, Ethernet, and the like may be employed to communicate alert information and provide the desired response (e.g., instructions, physical clamping, and the like) to designated aircraft systems. It is further contemplated that the system 100 may be complementary to other aircraft operation systems including Centralized Fault Display System (CFDS), Countermeasures System (CMC), and the like.

Figure 5:
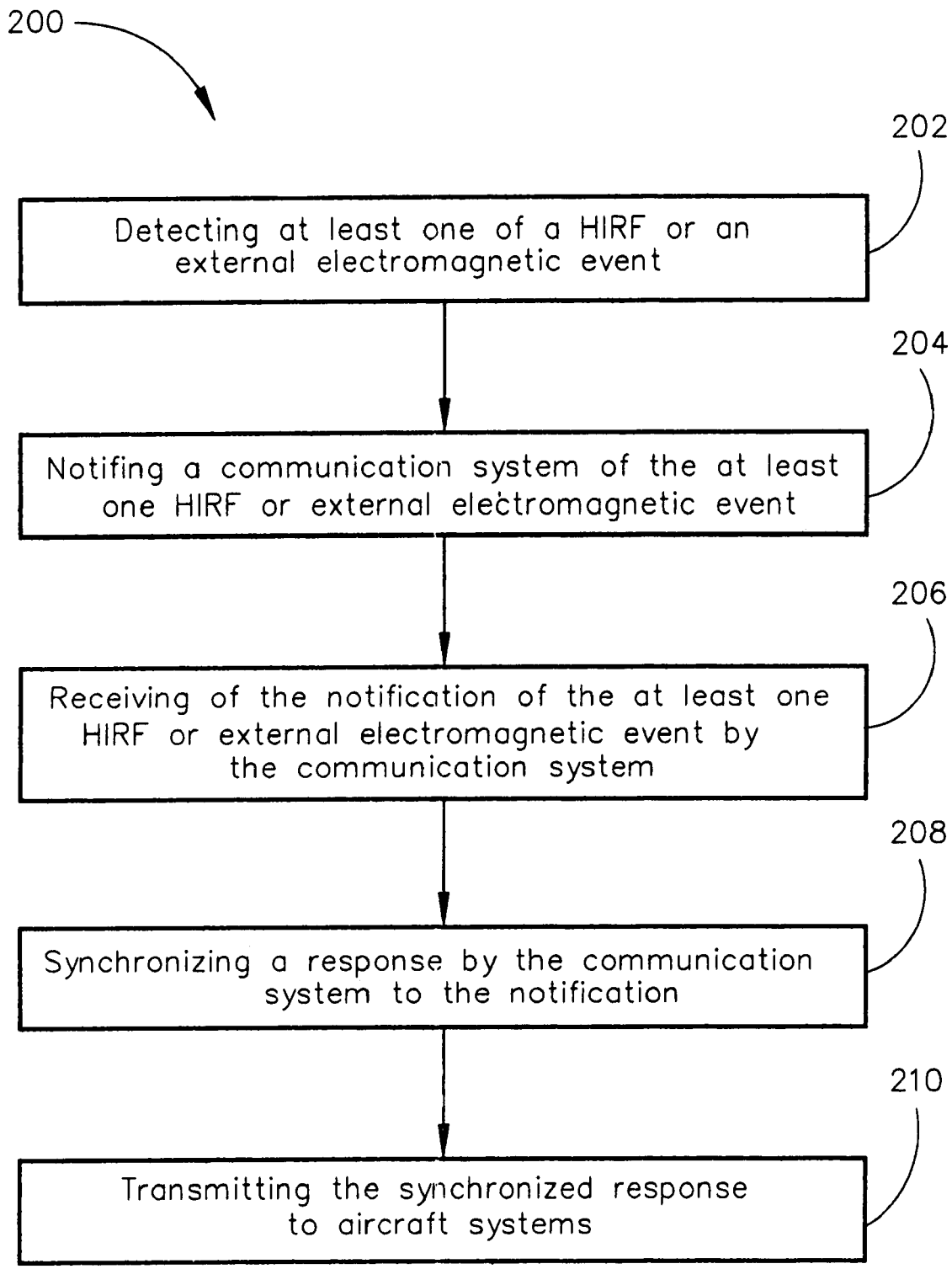
FIG. 5 is a flow diagram of a method for detecting HIRF or an electromagnetic event in accordance with an exemplary embodiment of the present invention.

Referring to FIG. 5, a method 200 for detecting HIRF or an external electromagnetic event is provided. The method 200 may include detecting at least one of a HIRF or an external electromagnetic event 202 such as lightning. For instance, a detector including a free space capacitive sensor and a protected amplifier circuit coupled with the free space capacitive sensor may be employed to detect lightning. Further, a detector including a broadband antenna and an envelope detector such as a high speed envelope detector may be employed to detect HIRF.

In addition, the method 200 may include notifying a communication system of the at least one HIRF or external electromagnetic event 204. In an embodiment, the communication system is a software defined radio communication system. Further, the communication system may be responsible for receiving and transmitting communication operations for an aircraft. The method 200 may include receiving the notification of the HIRF or external electromagnetic event 206 and synchronizing a response to such notification 208. Moreover, the method may include transmitting the synchronized response to aircraft systems 210

Figure 6:
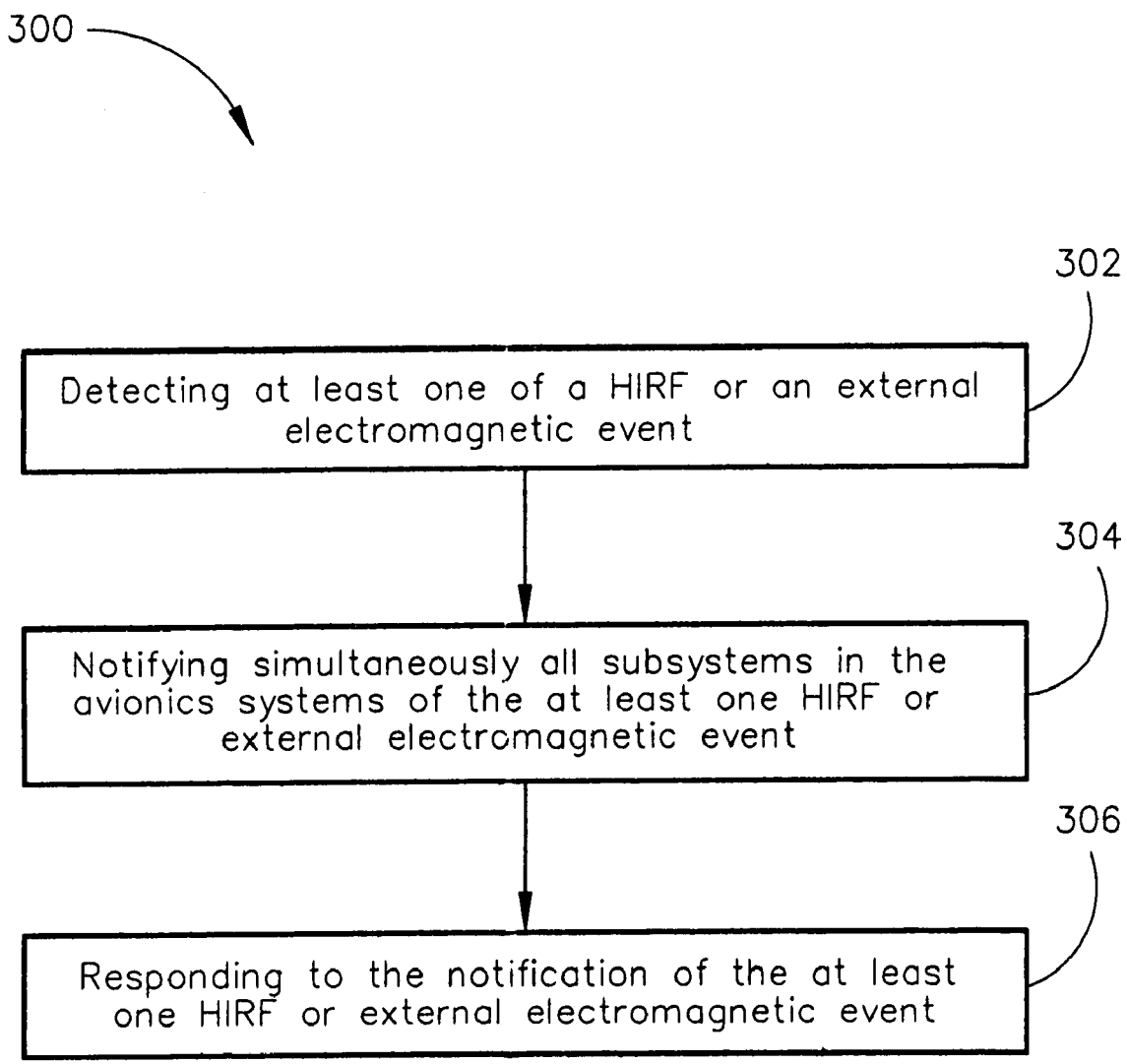
FIG. 6 is a flow diagram of an additional method for detecting and responding to HIRF or an electromagnetic event in accordance with an exemplary embodiment of the present invention.

Referring to FIG. 6, an additional method for detecting and responding to an HIRF or electromagnetic event is provided. In an exemplary embodiment, the method 300 includes detecting an HIRF or electromagnetic event 302. The method may also include simultaneously notifying all of the subsystems in the avionics system of the event 304. Such notification may cause the subsystems to form a response 306 such as entering into either a lightning or HIRF preparation mode or a lightning or HIRF "playthrough." Such response may depend upon various factors including detection level and type.

It is contemplated that the disclosed system and method may be implemented within a software-defined communication radio system including Joint Tactical Radio System (JTRS), Future Combat System (FCS), or similar software-defined radios. It is further contemplated that the disclosed system and method may be supported by avionic architectures including Integrated Modular Avionics (IMA) and Multi-Mode Multi-Function Avionics (MMDA. JTRS as well as FCS are a family of software defined radios that provide military users with voice, data and video communications as well as interoperability across the joint battle space. Such systems may be deployed in airborne platforms as well as selected maritime, fixed-station, and ground mobile platforms. The disclosed system and method are not, however, limited to these software-defined radios.

It is to be noted that the foregoing described embodiments according to the present invention may be conveniently implemented using conventional general purpose digital computers programmed according to the teachings of the present specification, as may be apparent to those skilled in the computer art. Appropriate software coding may readily be prepared by skilled programmers based on the teachings of the present disclosure, as may be apparent to those skilled in the software art.

It is to be understood that portions of the present invention may be conveniently implemented in forms of a software package. Such a software package may be a computer program product which employs a computer-readable storage medium including stored computer code which is used to program a computer to perform the disclosed function and process of the present invention. The computer-readable medium may include, but is not limited to, any type of conventional floppy disk, optical disk, CDROM, magneto-optical disk, ROM, RAM, EPROM, EEPROM, magnetic or optical card, or any other suitable media for storing electronic instructions.

It is understood that the specific order or hierarchy of steps in the foregoing disclosed methods are examples of exemplary approaches. Based upon design preferences, it is understood that the specific order or hierarchy of steps in the method can be rearranged while remaining within the scope of the present invention. The accompanying method claims present elements of the various steps in a sample order, and are not meant to be limited to the specific order or hierarchy presented.

It is believed that the present invention and many of its attendant advantages will be understood by the foregoing description. It is also believed that it will be apparent that various changes may be made in the form, construction and arrangement of the components thereof without departing from the scope and spirit of the invention or without sacrificing all of its material advantages. The form herein before described being merely an explanatory embodiment thereof. It is the intention of the following claims to encompass and include such changes.

What is claimed is:

1. A detection device, comprising:
   a free space capacitive sensor; and
   a protected amplifier circuit coupled with the free space capacitive sensor,
   wherein the free space capacitive sensor and the protected amplifier circuit are configured to respond to a voltage waveform produced by an external electromagnetic event in which the free space capacitive sensor serves as a single input capable of detecting the external electromagnetic event which allows subsystems in communication with the sensor and amplifier circuit to generate a coordinated response to the detected external electromagnetic event, the detection device being scalable to allow the detection device to be programmed to alert subsystems in communication with an amplifier once a voltage waveform above a specified threshold is detected, the specified threshold is according to at least one of an aircraft certification guideline or mission requirement.

2. The detection device as claimed in claim 1, wherein the detection device is employed to detect an external electromagnetic event for an aircraft.

3. The detection device as claimed in claim 1, wherein the detection device interacts with avionic architectures including at least one of a joint tactical radio system (JTRS) architecture, integrated modular avionic (IMA) architecture or multi-mode multi-function digital avionic (MMDA) architecture.

4. The detection device as claimed in claim 1, wherein the detection device further comprises a clamping circuit capable of clamping the voltage waveform at a specified voltage.

5. The detection device as claimed in claim 1, wherein the detection device further comprises a broadband antenna and an envelope detection device.

6. The detection device as claimed in claim 1, wherein the external electromagnetic event is lightning.

* * * * *